US008692351B2

(12) United States Patent
Kuo et al.

(10) Patent No.: US 8,692,351 B2
(45) Date of Patent: Apr. 8, 2014

(54) DUMMY SHOULDER STRUCTURE FOR LINE STRESS REDUCTION

(75) Inventors: Cheng Cheng Kuo, Hsinchu County (TW); Luke Lo, Taoyuan County (TW); Minghsing Tsai, Hsinchu County (TW); Ken-Yu Chang, Hsinchu (TW); Jye-Yen Cheng, Taichung (TW); Jeng-Shiun Ho, Hsinchu (TW); Hua-Tai Lin, Hsinchu (TW); Chih-Hsiang Yao, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 342 days.

(21) Appl. No.: 12/753,272

(22) Filed: Apr. 2, 2010

(65) Prior Publication Data

US 2011/0241207 A1  Oct. 6, 2011

(51) Int. Cl.
*H01L 21/70* (2006.01)
(52) U.S. Cl.
USPC ............ 257/508; 257/773; 257/776; 438/926

(58) Field of Classification Search
USPC .......................................... 257/508; 438/926
See application file for complete search history.

(56) References Cited

U.S. PATENT DOCUMENTS

| 2009/0072322 A1* | 3/2009 | Lee et al. ...................... 257/390 |
| 2010/0213569 A1* | 8/2010 | Wu et al. ...................... 257/529 |

* cited by examiner

*Primary Examiner* — Daniel Whalen
(74) *Attorney, Agent, or Firm* — Haynes and Boone, LLP

(57) ABSTRACT

Semiconductor integrated circuit line structures for improving a process window in the vicinity of dense-to-isolated pattern transition areas and a technique to implement the line structures in the layout process are described in this disclosure. The disclosed structure includes a semiconductor substrate, and a material layer above the substrate. The material layer has a closely spaced dense line structure, an isolated line structure next to the dense line structure, and a dummy line shoulder structure formed in the vicinity of the dense line and the isolated line structures. One end of the dummy line shoulder structure connects to the isolated line structure and another end extends away from the isolated line structure in an orientation substantially perpendicular to the isolated line structure.

20 Claims, 6 Drawing Sheets

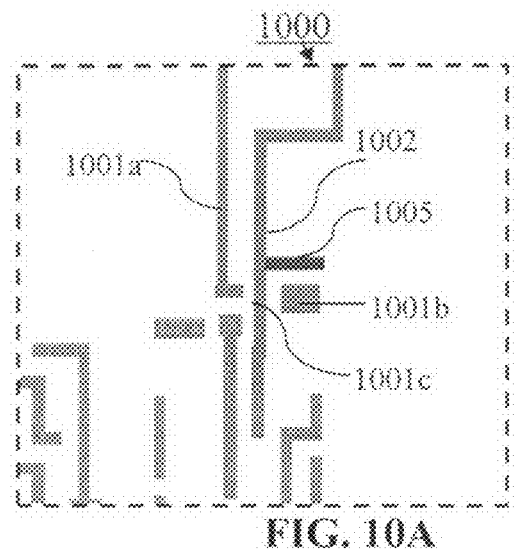
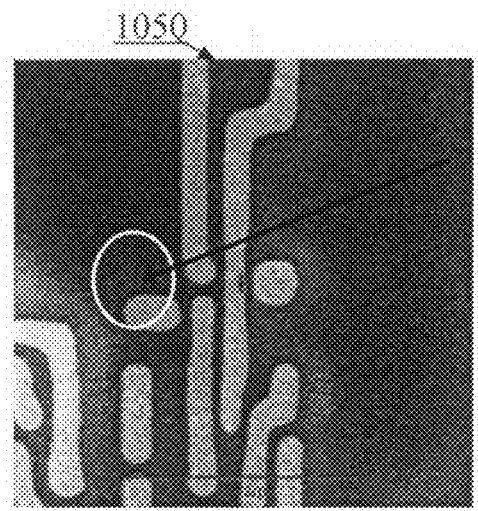
FIG. 10A          FIG. 10B
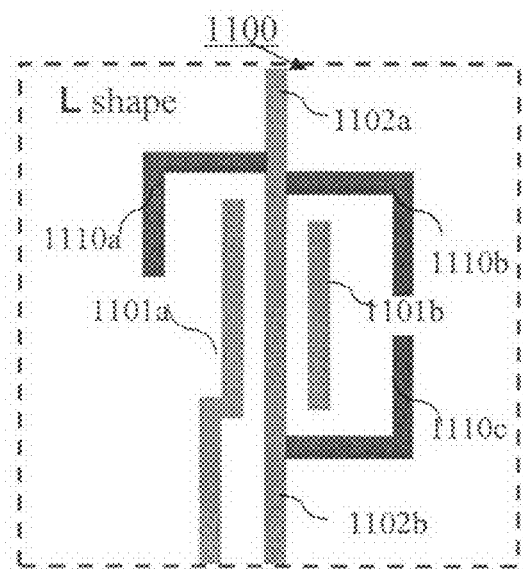
FIG. 11

FIG. 12B     FIG. 12C

DUMMY SHOULDER STRUCTURE FOR LINE STRESS REDUCTION

TECHNICAL FIELD

The present disclosure relates generally to semiconductor integrated circuitry technology, and more particularly, to line feature patterns in integrated circuitry and methods of making the same.

BACKGROUND

Technological advances in semiconductor integrated circuit (IC) materials, design, processing, and manufacturing have enabled scaling IC devices where each generation has smaller and more complex circuits than the previous generation.

Processes for fabricating wafers of integrated circuits consist of a series of steps by which a set of geometric patterns, determined by the transistors and their interconnections, are transformed onto numerous superimposed layers made of semiconductor, insulating, and conducting materials on top of a substrate. The interconnection of superimposed layers is achieved by connecting conductive lines in the layers with conductive contact holes and vias, the contact holes and vias being processed like plugs perpendicular to the layers where the conductive lines reside. However, as transistors are scaled down to form integrated circuits with higher levels of integration and faster speeds, physical phenomena from tight pitch P of circuits impinge the desired performance of the interconnecting circuitry. In the case of a conductive layer, metal lines ideally should remain at designed widths. However, metal linewidth varies from many factors. For example, some lines shrink or swell because of the optical proximity effect in the lithographic process, and other lines change from surface topography differences in regions with different pattern densities, for example, as a result of uneven loads in a chemical mechanical polishing (CMP) process or an etching process. The optical proximity effect during lithography process generates a linewidth bias between isolated and dense features. Process limitations degrade effective critical dimensions on the wafer. In some cases, an isolated line can be printed much wider than dense lines of the same designed width. The linewidth bias induces the film stress at the dense-to-isolated line transition vicinity (also called the line estuaries), generating defects known as metal pits, for example, the "copper line voids". In an extreme case, metal lines may "lift off" or simply break. Although IC manufacturers have implemented various strategies including Optical Proximity Correction (OPC) models and sophisticated design rules in circuitry layout to better control critical dimensions, it has been a challenging task to avoid metal line stress defects at the metal line estuaries. Although described as a metal line problem, the line estuary stress also resides in processing lines of poly, dielectric, semiconductors, and other materials.

Therefore, an effective and easy-to-implement technique is desired to reduce line stress at the dense-to-isolated line transitional area in IC process and manufacturing.

SUMMARY

One embodiment of the present disclosure includes a line structure in a semiconductor integrated circuitry (IC). The line structure is formed in a layer over a substrate and the line structure includes: a plurality of a first type of lines, the first type of lines are closely spaced patterns (dense lines); a plurality of a second type of line (isolated line) formed in the vicinity of the first type of dense lines; and in addition, there are a plurality of a third type of lines formed in the vicinity of the first type of dense lines and the second type of isolated line. The third type of lines connect to the second type of isolated line and extend in an orientation substantially perpendicular to the second type of isolated line.

Another embodiment of the present disclosure includes a semiconductor integrated circuitry (IC) having a substrate, an insulating layer formed over the substrate including an interconnecting circuitry such as contact holes or vias, and a conductive line structure on top of the insulating layer. The conductive line structure includes a plurality of a first type of conductive lines that are closely spaced patterns (dense lines) connected to the interconnecting circuitry in the insulating layer. There are a plurality of a second type of conductive line (isolated line) in the vicinity of the dense lines, and the isolated line is connected to the interconnecting circuitry in the insulating layer. There are also a plurality of a third type of conductive line (conductive shoulder) formed in the vicinity of the dense lines and isolated line, and the conductive shoulder is connected to the isolated line and is formed in an orientation substantially perpendicular to the isolated line. The conductive shoulder is not connected to the interconnecting circuitry, such as contact holes or vias, in the insulating layer. The conductive shoulder is used as a protective structure for line processing, therefore the shoulder does not need to electrically connect to the interconnecting circuitry in the insulating layer either below or above the conductive line layer. However, the conductive shoulder can be connected to dummy vias in the adjacent insulating layer. Dummy vias are non-functional structures built for process improvement reasons.

Another embodiment of the present invention involves a method for designing a line structure in an IC. The method includes identifying an estuary region in the vicinity of an isolated line and a plurality of dense lines; and adding a dummy line shoulder in the estuary region, wherein the dummy line shoulder connects to and is substantially perpendicular to the isolated line. Identifying an estuary region can includes step 1: identifying the dense lines having a line width less than a predefined width; step 2: identifying spaces sandwiched between the dense lines identified in step 1; step 3: grouping the spaces identified in step 2 into one block; step 4: defining the edge boundaries of the block in step 3 as the estuary region; step 5: drawing a first box of a predetermined size using the estuary region and the isolated line as borders; step 6: drawing a second box within a portion of the first box, the second box using the isolated line as a border and keeping a predetermined distance from the dense lines.

Further embodiments and aspects of the invention are discussed with respect to the following figures, which are incorporated in and constitute a part of this specification.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 10A shows a top view of a metal line structure having dummy metal line shoulders according to some embodiments of the present disclosure, and FIG. 10B is a SEM image of an unprotected metal line structure.

FIG. 11 shows a top view of a line structure including protective L-shaped dummy line shoulders according to an alternative embodiment of the present disclosure.

FIGS. 12A-D show a process flow for implementing dummy line shoulders in the vicinity of a line structure according to various embodiments of the present disclosure.

DETAILED DESCRIPTION

Figure 1:
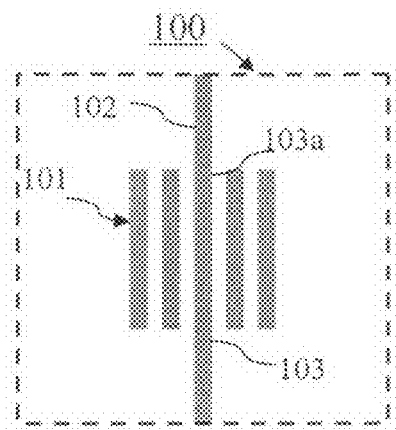
FIG. 1 shows a top view of a line structure.

The present disclosure relates to semiconductor integrated circuitry line feature processing and methods for implementing integrated circuitry line features. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Hereinafter, embodiments of the present invention will be explained in detail with reference to the accompanying drawings.

The following descriptions may refer to conductive lines, but the disclosure is not limited to conductive lines. The conductive lines may include metal lines, such as copper, aluminum, tungsten, platinum, or many forms of alloys. The conductive lines may also include non-metallurgical conductive lines, such as semiconductor lines.

In a conductive layer of an integrated circuit, a good process technology should produce metal lines that satisfy critical dimension (CD) requirements for a wide variety of patterned feature densities residing in vicinity. One example of a simple transitional line structure 100 is illustrated in FIG. 1, which shows a top view of a parallel line structure 101 transforming to an isolated single line 102. The line cluster 101 is often referred to as dense lines and the single line 102 is often referred to as an isolated line. An isolated line often is an extension of one of the dense lines in the vicinity of the dense lines. The dense-to-isolated line transitional areas 103a above the line cluster and 103b at the bottom of the line cluster are often referred to as line estuaries.

Figure 2:
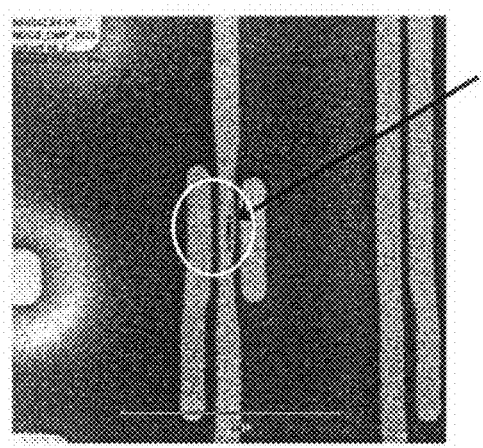
FIG. 2 is a SEM image showing pit defects in a copper line.

Line estuaries present process challenges. Many process limitations from lithography, etching, polishing, materials, film deposition, and surface topography pose severe difficulties to linewidth control at the line estuaries. For example, an isolated metal line often is printed much wider than nearby dense lines of the same design width on the same layer. A sudden linewidth change causes severe film stress at the dense-to-isolated transitional line estuary, resulting in metal line defects such as film voids. In the extreme case, metal lines may "lift off" or develop large pits leading to broken lines. FIG. 2 is a SEM image showing one example of a pit defect in the middle of a dense copper line at the estuary.

Figure 3:
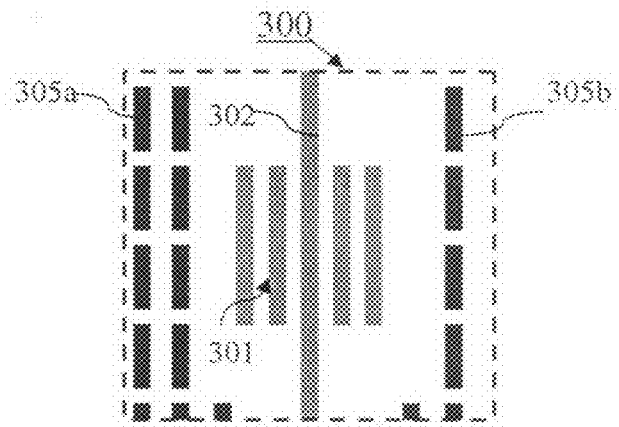
FIG. 3 shows a top view of a line structure closely spaced with a protective dummification structure.

Applying Optical Proximity Correction (OPC) models in lithography exposure improves line printing uniformity in general, but does not reduce linewidth variations sufficiently at the dense-to-isolated line transitional areas. Sophisticated design rules commonly used in circuitry layout add dummy features around line structures. FIG. 3 shows a top view of a transitional line structure 300 having dummy structures 305a and 305b fabricated around a dense line cluster 301 and an isolated line 302. However, even at a minimum pitch distance from the dense and isolated lines, dummy structures often prove to be insufficient in mitigating line stress at the dense-to-isolated line estuaries. In addition, there are known disadvantages of closely spaced dummy features, for example: 1) the dummy features interfere with the circuitry's electrical characteristics and distort design RC and/or 2) the tight pitch of the dummy patterning degrades the process window.

Figure 4:
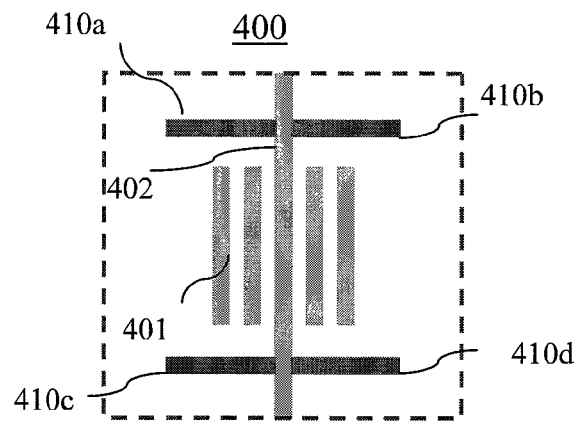
FIG. 4 shows a top view of a line structure protected with dummy line shoulders according to some aspects of the present disclosure.

Dummy line shoulders in the current disclosure can mitigate line density transitional stress without reducing the process window. For example, FIG. 4 shows a top view of a transitional line structure 400 having an exemplary dummy line shoulder structure according to some embodiments of the present disclosure. In FIG. 4, four dummy line shoulders, 410a, 410b, 410c, and 410d, are fabricated in transitional areas where a dense line cluster 401 transforms to an isolated line 402. The protective dummy line shoulders 410a, 410b, 410c, and 410d connect at one end to the isolated line 402 and extend away from the isolated line 402 in an orientation almost perpendicular to the isolated line 402. However the shoulders do not have to extend perpendicularly to the isolated line 402, as long as the shoulders do not connect to the dense lines 401 or other structures in the vicinity to cause undesirable functional errors. The length of each dummy line shoulder should be long enough to protect the line estuary area. The dummy line shoulder overall dimensions should be at least at the layer's minimum dimension or pitch so it does not cause additional process challenges. The dummy line shoulders are not electrically functional features and therefore are not electrically connected to interconnecting circuitry in other layers such as contacts or vias. However, the dummy line shoulders can be connected to dummy interconnecting circuitry in other layers for the purpose of process convenience. In one embodiment, a dummy line shoulder has a length greater than 1.0 times the sandwiched space between the dense lines 401.

Figure 5A:
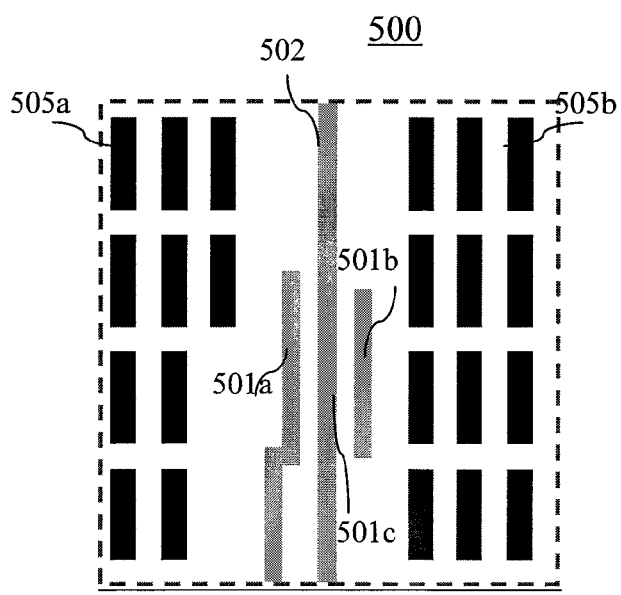
FIG. 5A shows a top view of a transitional line feature protected by a first dummy structure.

FIG. 5A illustrates a line structure 500 that includes dense line portions 501a, 501b, and 501c in the middle section, and an isolated line portion 502 that extends up from the dense line portion 501c. Dummification features 505a and 505b are fabricated around the dense and isolated lines. The dummification features 505a and 505b both include many individual dummy features often drawn at or near the critical dimensional size for the relevant layer.

Figure 5B:
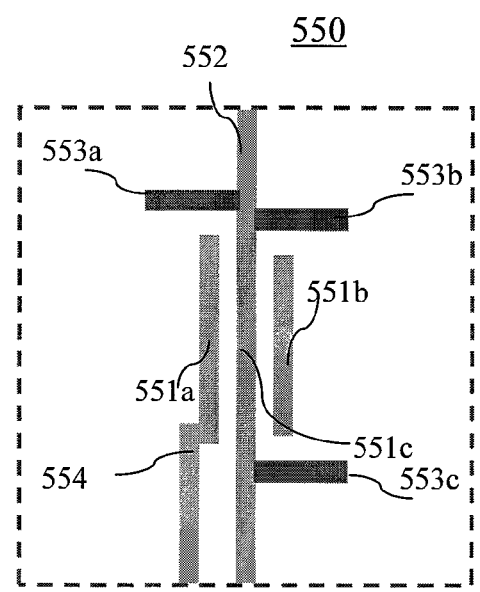
FIG. 5B shows a top view of a transitional line feature including dummy line shoulders according to a second dummy structure.

FIG. 5B illustrates a line structure 550, similar to line structure 500 in FIG. 5A, that includes dense line portions 551a, 551b, and 551c in the middle section, an isolated line portion 552 that extends up from the dense line portion 551c, and an exemplary set of protective dummy line shoulders 553a, 553b, and 553c fabricated at the dense-to-isolated line transitional locations. In the illustrated embodiment, each of the dummy line shoulders 553a, 553b, and 553c connects to the isolated line portion 552 and extends away from the isolated line portion 552 perpendicularly. In other embodiments, the shoulders do not have to extend out perpendicularly from the isolated line portion 552, as long as the dummy line shoulders do not connect to the dense line portions 551a, 551b, or other structures in the vicinity to cause undesirable functional errors. Line portion 554 extends from portion 551a via a kink and line portion 554 is not at a critical dimension distance from line 551c below the line structure, thus in the present embodiment, a dummy line shoulder is not needed for line portion 551c near line portion 554. In an embodiment where the extended line portion 554 is too close to the nearby line 551c to process the features correctly, a dummy line shoulder may be useful.

The length of each dummy line shoulder should be long enough to protect the estuary features. The dummy line shoulder overall dimensions should be not smaller than the layer's minimum dimension so it does not cause additional process challenges. The dummy line shoulders are not electrically functional features and therefore need not be electrically connected to interconnecting circuitry in other layers such as contacts or vias. However, the dummy line shoulders can be connected to dummy interconnecting circuitry in other layers for the purpose of process convenience. For simplicity of description, the rules explained in this paragraph apply to all dummy line shoulders in the following examples.

Figure 6:
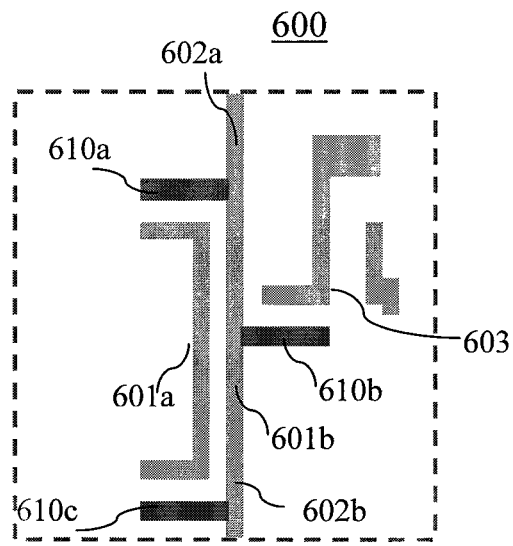
FIG. 6 shows a top view of a line structure including dummy line shoulders according to another embodiment of the present disclosure.

FIG. 6 shows a top view of an exemplary set of dummy line shoulders next to a designed line structure according to one or more embodiments of the present disclosure. A line structure 600 includes a dense line cluster composed of parallel lines 601a and 601b, two isolated extension lines (an isolated line 602a above the dense lines and an isolated line 602b below the dense lines), and a separate structure 603 nearby at a distance close to the minimum dimension in the layer. Three dummy line shoulders 610a, 610b, and 610c are fabricated in line structure 600, where shoulder 610a connects to the isolated line 602a at its estuary, shoulder 610c connects to the isolated line 602b at its estuary, and shoulder 610b connects to the middle of line 610b near the end of 603. Even though line 603 does not extend from line 601b directly, the linewidth uniformity of line 601b is improved by having the protection of the dummy line shoulder 610b.

Many varieties of dense-to-isolated line structures, which have linewidths at or near the process critical dimension limits, can benefit from the protection of the dummy line shoulders in the present disclosure. FIGS. 7, 8, 9 and 10 illustrate a number of examples where the line structures are protected by the dummy line shoulders according to one or more embodiments of the present disclosure. Also shown are SEM images of defected lines with pits and voids near line estuaries, resulting from film stress at the transition.

Figure 7A:
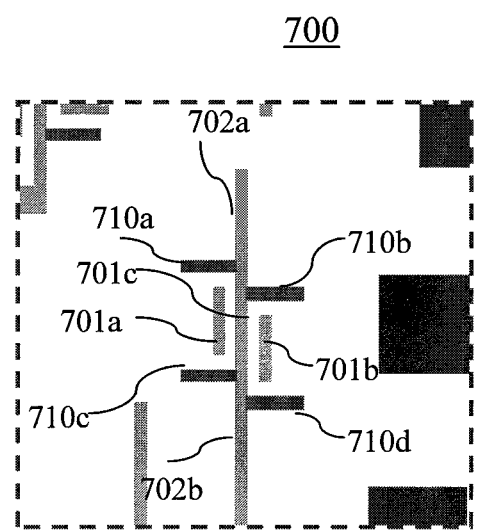
FIG. 7A shows a top view of a metal line structure having dummy metal line shoulders according to some embodiments of the present disclosure.
Figure 7B:
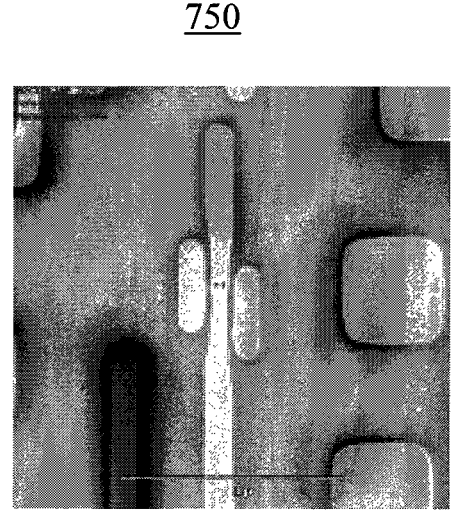
FIG. 7B is a SEM image of an unprotected metal line structure.

FIG. 7A shows a top view of a line feature 700 protected by dummy line shoulders according to some embodiments of the present disclosure. The line structure to be protected in FIG. 7A includes dense line portions 701a, 701b, and 701c in the middle section, an isolated line 702a that extends up from one of the dense lines 701c, and another isolated line 702b that extends down from one of the dense lines 701c. An exemplary set of protective dummy line shoulders 710a, 710b, 710c, and 710d are fabricated at the dense-to-isolated line transitional locations, according to some embodiments of the present disclosure. Each of the dummy line shoulders 710a, 710b, 710c, and 710d connects to the isolated lines 702a, 702b at one end and extends away from the isolated lines 702a, 702b perpendicularly. The dummy shoulders 710a and 710b, or 710c and 710d, are not aligned at the ends because lines 701a and 701b are not aligned. However, the dummy shoulders do not have to extend out perpendicularly from the isolated lines 702a or 702b, as long as the shoulders do not connect to the dense lines 701a and 701b, or other structures in the vicinity to cause undesirable functional errors. Without the dummy shoulder protection, a line pit was developed as shown in an SEM image in FIG. 7B.

Figure 8A:
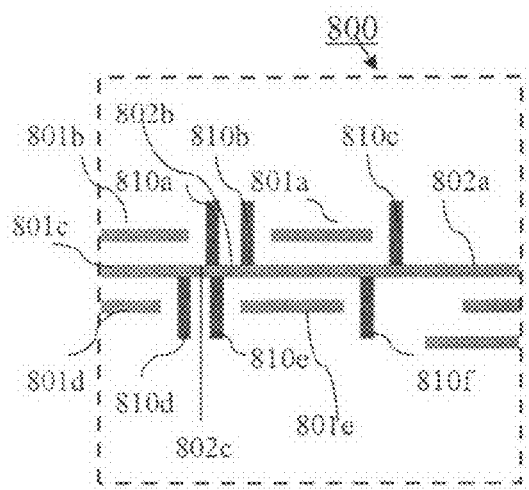
FIG. 8A shows a top view of a metal line structure having dummy metal line shoulders according to another embodiment of the present disclosure.
Figure 8B:
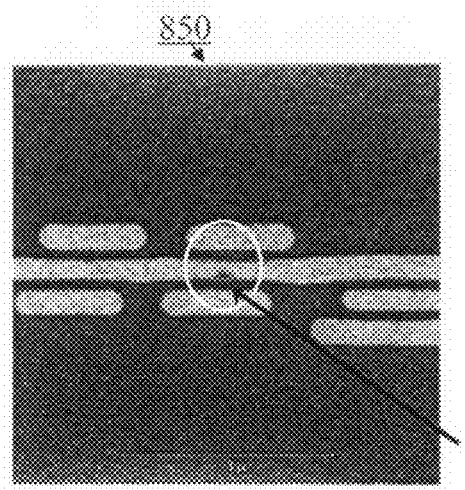
FIG. 8B is a SEM image of an unprotected metal line structure.

FIG. 8A shows a top view of a line feature 800 protected by dummy line shoulders according to other embodiments of the present disclosure. The line structure to be protected in FIG. 8A includes staggered dense line portions 801a, 801b, 801c, 801d, and 801e in the middle section, an isolated line portion 802a that extends from dense line portion 801c, two isolated line portions 802b and 802c in between the staggered dense line portions 801a, 801b, 801d, and 801e, respectively. An exemplary set of protective dummy line shoulders 810a, 810b, 810c, 810d, 810e, and 810f are fabricated at the dense-to-isolated line transitional locations, according to one embodiment. Each of the dummy line shoulders 810a, 810b, 810c, 810d, 810e, and 810f connects to a line estuary of the isolated line portion 802a or an isolated section 802b or 802c, respectively. In the present embodiment, each dummy line shoulder starts with one end contacting the isolated line or section and extends away from the isolated line or section perpendicularly. In other embodiments, the dummy shoulders 810a, 810b, 810c, 810d, 810e, and 810f do not have to extend out perpendicularly from the isolated line 802a or isolated section 802b and 802c, as long as the shoulders do not connect to any of the dense lines 801a, 801b, 801d, 801e, or other structures in the vicinity to cause undesirable functional errors. Without the dummy shoulder protection, film stress caused a line pit to develop as shown in a SEM image in FIG. 8B.

Figure 9A:
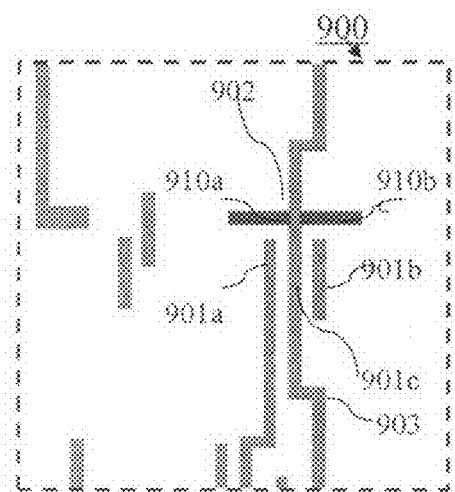
FIG. 9A shows a top view of a metal line structure having dummy metal line shoulders according to some embodiments of the present disclosure.
Figure 9B:
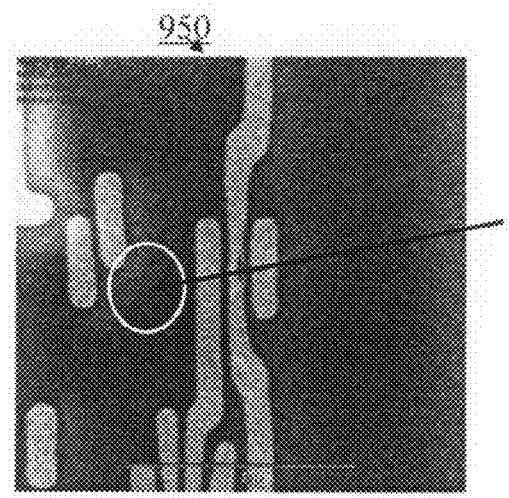
FIG. 9B is a SEM image of an unprotected metal line structure.

FIG. 9A shows a top view of a line feature 900 protected by dummy line shoulders according to one or more embodiments of the present disclosure. The line structure to be protected in FIG. 9A includes a dense line cluster composed of lines 901a, 901b, and 901c in the middle section, and an isolated line portion 902 that extends up from dense line 901c. An exemplary set of protective dummy line shoulders 910a and 910b are fabricated at the dense-to-isolated line transitional location, according to some embodiments of the present disclosure. Each of the dummy line shoulders 910a and 910b connects to the same line estuary of the isolated line 902 from opposing directions, and extends away from the isolated line 902 perpendicularly, forming a cross-like feature. This cross-like feature is common for an estuary that has symmetric dense lines ending together on each side of the isolated portion at the transition. However, the dummy shoulders 910a and 910b do not have to extend out perpendicularly from the isolated line 902, as long as the shoulders do not connect to any of the dense lines 901a and 901b, or other structures in the vicinity to cause undesirable functional errors. Without the dummy shoulder protection, film stress causes a line pit as shown in a SEM image in FIG. 9B.

Some dense line clusters compose closely spaced features that are not lines. One example is illustrated in FIG. 10A, which provides a top view of a line structure 1000 that includes an irregular dense feature. The irregular dense cluster includes a short line feature 1001a, a nearby small pad 1001b, and a line 1001c sandwiched in between 1001a and 1001b. An isolated line 1002 extends above the dense line 1001c and forms an estuary at the transition to the right side. An exemplary dummy line shoulder 1005 is fabricated above the pad 1001b, according to some embodiments of the present disclosure. Dummy line shoulder 1005 connects to the isolated line 1002 just above the pad 1001b and extends away from the isolated line 1002 perpendicularly. However, the dummy shoulder 1005 does not have to extend out perpendicularly from the isolated line 1002, as long as the shoulder 1005 does not connect to any of the dense features 1001a, 1001b, or other structures in the vicinity to cause undesirable functional errors. Without the dummy shoulder protection, film stress caused a line pit to develop in one of the unprotected lines near the close-by pad as shown in a SEM image in FIG. 10B.

A protective dummy line shoulder can also be formed in shapes of an "L", an "O", a "U", or a variety of curves, instead of the straight lines described in the previous paragraphs. One alternative exemplary embodiment of the present disclosure includes an L-shaped dummy line shoulder shown in FIG. 11. A top view of a designed feature 1100 illustrates a dense line cluster composed of lines 1101a, 1101b, and 1101c in the middle section, an isolated line 1102a that extends up from one of the dense lines 1101c, and an isolated line 1102b that extends down from the dense line 1101c. An exemplary set of protective L-shaped dummy line shoulders 1110a, 1110b, and 1110c are fabricated at the dense-to-isolated line transitional locations. Each of the L-shaped dummy line shoulders 1110a, 1110b, and 1110c connects to one line estuary at one end of the L-shaped shoulder feature and extends away from the isolated line 1102a or 1102b perpendicularly. However, the dummy L-shaped shoulders 1110a, 1110b, and 1110c do not have to extend away perpendicularly from the isolated lines 1102a or 1102b, as long as the L-shaped shoulders do not connect to any of the dense lines 1101a or 1101b, or other structures in the vicinity to cause undesirable functional errors.

Figure 12A:
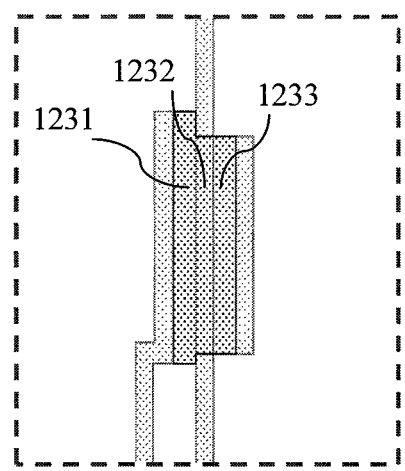
Figure 12D:
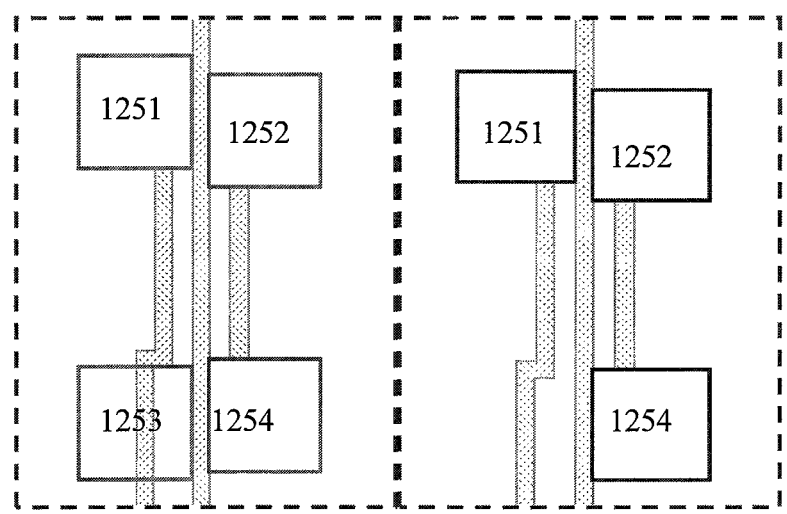
Figure 12D:
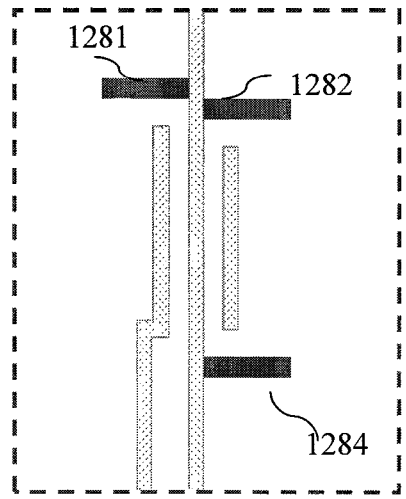

FIGS. 12A-D illustrate a step-by-step exemplary flow for implementing the dummy line shoulder structures in the layout process according to one or more embodiments of the present disclosure. FIG. 12A (Step 1) shows how to define a location where a dummy line shoulder is needed. In Step 1, lines and spaces at or near the critical dimension of the related layer are identified, and grouped together to form a block with line 1232 sandwiched in between the spaces 1231 and 1233. FIGS. 12B and 12C illustrate Step 2 how the estuary boxes are identified. In Step 2, square boxes of a predetermined size are drawn using the edges of the block and the isolated portions of line 1232 as borders (FIG. 12B). A box containing a line feature, for example, box 1253, is filtered out (FIG. 12C). A discarded box is not considered appropriate for locating a dummy line shoulder because it does not include any isolated structures. As a result only boxes 1251, 1252 and 1254 are the estuary boxes. The predetermined size of the estuary boxes is decided by process conditions such as critical dimension of the line, dense line pitch, desired transitional linewidth correction, and other process parameters in the vicinity of the line features. FIG. 12D illustrates Step 3 when a dummy line shoulder is finally drawn within an estuary box. In Step 3, dummy line shoulder structures 1281, 1282, and 1284 each are created in a estuary box 1251, 1252, or 1254 respectively, the dummy line shoulders connect and extend away almost perpendicularly from the isolated line, at a defined distance from the estuary side to keep the dummy line shoulder structure from touching the dense line features. However, the dummy line shoulders do not have to form nearly 90 degree angles from the isolated lines. The dummy line shoulders can be straight lines or bending lines such as an L-shaped line.

An experiment on split wafers has been performed to compare print results of a metal line structure shown in FIG. 1. Each split was processed by applying a different technique. Table 1 summarizes the experimental results shown as linewidth errors: Split A gets no protection and has a one-sigma error of −5.7 nm; Split B shows a one-sigma error of −2.9 nm by using the conventional dummification patterns spaced 100 nm away from the metal lines; and Split C has a one-sigma error of −1.7 nm, a significant improvement after applying the dummy line shoulder technique, as disclosed in some embodiments of the current invention.

TABLE 1

Summary of linewidth errors in a split wafer experiment

| Split | Condition | Error (nm) |
|---|---|---|
| A | No dummy | −5.7 |
| B | Dummy w/100 nm space | −2.9 |
| C | Dummy line shoulder | −1.7 |

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor integrated circuitry (IC), comprising:
 a substrate;
 a layer is formed over the substrate, the layer further comprising:
  a plurality of dense lines including closely spaced patterns;
  an isolated line formed in the vicinity of the plurality of dense lines and extending along an axis substantially parallel to the plurality of dense lines; and a plurality of dummy lines formed in the vicinity of the plurality of dense lines and the isolated line, wherein the plurality of dummy lines connect to the isolated line, and wherein the plurality of dummy lines are formed in an orientation substantially perpendicular to the isolated line, and wherein the plurality of dummy lines do not connect to the dense lines.

2. The semiconductor IC of claim 1, wherein the plurality of dense lines, the isolated line, and the plurality of dummy lines comprise conductive lines.

3. The semiconductor IC of claim 2, wherein the conductive lines comprise metal lines.

4. The semiconductor IC of claim 3, wherein the metal lines further comprise Cu, tungsten, aluminum, platinum, or alloys.

5. The semiconductor IC of claim 2, wherein the conductive lines comprise non-metallurgical lines.

6. The semiconductor IC of claim 1, wherein the plurality of dummy lines are formed in an L-shape or a U-shape.

7. The semiconductor IC of claim 1, wherein the plurality of dummy lines connect to the isolated line like a T.

8. The semiconductor IC of claim 1, wherein the plurality of dummy lines connect to the isolated line like a cross.

9. The IC of claim 1, wherein the plurality of dense lines, the isolated line, and the plurality of dummy lines are disposed within a same material layer.

10. An integrated circuit (IC) comprising:
a substrate;
a conductive line structure on top of the substrate, the line structure including:
a first type of conductive lines including closely spaced patterns (dense lines), wherein at least one of the dense lines extends along a first axis;
a second type of conductive line (isolated line) formed in the vicinity of the dense lines and extending along a second axis, the second axis being substantially parallel with respect to the first axis; and
a third type of conductive line (conductive shoulder) formed in the vicinity of the dense lines and the isolated line,
wherein the conductive shoulder connects to the isolated line, formed in an orientation substantially perpendicular to the isolated line,
wherein the conductive shoulder does not connect to the dense lines,
wherein the conductive shoulder includes a plurality of conductive shoulders, and
wherein there are more conductive shoulders connected to a first side of the isolated line than a second opposing side of the isolated line.

11. The IC of claim 10, wherein the first type of conductive lines, the second type of conductive line, and the third type of conductive line comprise metal lines.

12. The IC of claim 11, wherein the metal lines comprise copper, aluminum, tungsten, or alloys.

13. The IC of claim 10, wherein the dense lines include a pitch (P) and the conductive shoulder includes a length greater than about one pitch (P).

14. The IC of claim 10, wherein the third type of conductive line is formed in an L-shape having a main segment and a supplementary segment, the main segment is substantially perpendicular to the isolated line and the supplementary segment is substantially parallel with the isolated line.

15. The IC of claim 10, wherein the at least one of the dense lines, the isolated line, and the conductive shoulder are disposed within a same material layer.

16. The IC of claim 10, wherein the conductive shoulder physically contacts a portion of the isolated line.

17. The IC of claim 10, wherein the dense lines include a first dense line and a second dense line, and
wherein the isolated line is disposed between the first and second dense lines without contacting the first and second dense lines.

18. The IC of claim 10, wherein the conductive shoulder includes a first conductive shoulder and a second conductive shoulder, and
wherein the at least one of the dense lines extends between the first and second conductive shoulders without contacting the first and second shoulders.

19. The IC of claim 10, wherein the conductive shoulder physically contact the isolated line.

20. The IC of claim 10, wherein at least one of the conductive shoulders from the plurality of conductive shoulders has an L-shaped profile.

* * * * *